(12) United States Patent
Halsey, IV et al.

(10) Patent No.: US 8,466,882 B2
(45) Date of Patent: Jun. 18, 2013

(54) TOUCH SENSOR AND METHOD FOR MANUFACTURING SAME

(75) Inventors: Eugene L. Halsey, IV, Holland, MI (US); Mondher Cherif, Holland, MI (US)

(73) Assignee: TPK Touch Solutions Inc., Taipei (TW)

( * ) Notice: Subject to any disclaimer, the term of this patent is extended or adjusted under 35 U.S.C. 154(b) by 961 days.

(21) Appl. No.: 12/430,323

(22) Filed: Apr. 27, 2009

(65) Prior Publication Data

US 2009/0205879 A1    Aug. 20, 2009

Related U.S. Application Data

(63) Continuation-in-part of application No. PCT/US2008/071034, filed on Jul. 24, 2008.

(60) Provisional application No. 60/952,428, filed on Jul. 27, 2007, provisional application No. 61/048,402, filed on Apr. 28, 2008.

(51) Int. Cl.
*G06F 3/041* (2006.01)

(52) U.S. Cl.
USPC .......................................... 345/173; 200/600

(58) Field of Classification Search
USPC ....................................................... 200/600
See application file for complete search history.

(56) References Cited

U.S. PATENT DOCUMENTS

| | | | |
|---|---|---|---|
| 3,020,193 A | 2/1962 | Seek | |
| 3,293,743 A | 12/1966 | Barnard | |
| 3,415,706 A | 12/1968 | Ettre | |
| 4,290,052 A | 9/1981 | Eichelberger et al. | |
| 4,318,958 A | 3/1982 | Piatt | |
| 4,490,227 A | 12/1984 | Bitter | |
| 4,650,557 A | 3/1987 | Bitter | |
| 4,655,811 A | 4/1987 | Bitter | |
| 4,786,767 A | 11/1988 | Kuhlman | |
| 4,838,656 A | 6/1989 | Stoddard | |
| 4,864,084 A | 9/1989 | Cardinale | |
| 4,931,782 A | 6/1990 | Jackson | |
| 5,011,732 A | 4/1991 | Takeuchi et al. | |
| 5,062,198 A | 11/1991 | Sun | |
| 5,239,152 A | 8/1993 | Caldwell et al. | |
| 5,277,986 A | 1/1994 | Cronin et al. | |
| 5,525,264 A | 6/1996 | Cronin et al. | |
| 5,538,905 A | 7/1996 | Nishioka et al. | |
| 5,604,626 A | 2/1997 | Teowee et al. | |
| 5,673,041 A | 9/1997 | Chatigny et al. | |
| 5,689,157 A | 11/1997 | Jitsukata et al. | |

(Continued)

FOREIGN PATENT DOCUMENTS

| | | |
|---|---|---|
| WO | WO 2009/006512 | 1/2009 |
| WO | WO 2009/018094 | 2/2009 |

*Primary Examiner* — Vanessa Girardi
(74) *Attorney, Agent, or Firm* — Gokalp Bayramoglu; Anna Tsang

(57) ABSTRACT

A touch sensor, such as a capacitive touch sensor, includes a substrate having at least one passageway established therethrough. A first conductive coating is established at a first surface of the substrate, and a conductive element is disposed at the substrate and at least partially through the passageway. The conductive element establishes conductive continuity between the first surface and second or opposite surface of the substrate. A thin sheet (such as a thin glass or plastic sheet) is disposed at and over the first surface of the substrate. The passageway may comprise multiple passageways established inboard of a perimeter edge of the substrate. The thin glass or plastic sheet may be laminated at or to the substrate.

21 Claims, 14 Drawing Sheets

U.S. PATENT DOCUMENTS

| | | |
|---|---|---|
| 5,719,705 A | 2/1998 | Machol |
| 5,725,957 A | 3/1998 | Varaprasad et al. |
| 5,729,379 A | 3/1998 | Allemand et al. |
| 5,742,118 A | 4/1998 | Endo et al. |
| 5,838,483 A | 11/1998 | Teowee et al. |
| 5,900,275 A | 5/1999 | Cronin et al. |
| 6,001,486 A | 12/1999 | Varaprasad et al. |
| 6,040,939 A | 3/2000 | Demiryont et al. |
| 6,087,012 A | 7/2000 | Varaprasad et al. |
| 6,163,313 A | 12/2000 | Aroyan et al. |
| 6,261,700 B1 | 7/2001 | Olson et al. |
| 6,277,485 B1 | 8/2001 | Invie et al. |
| 6,344,288 B1 | 2/2002 | Oyama et al. |
| 6,362,414 B1 | 3/2002 | Fujisawa et al. |
| 6,380,480 B1 | 4/2002 | Norimatsu et al. |
| 6,395,863 B2 | 5/2002 | Geaghan |
| 6,440,491 B1 | 8/2002 | Varaprasad et al. |
| 6,444,898 B1 | 9/2002 | Fujisawa et al. |
| 6,488,981 B1 | 12/2002 | Richter et al. |
| 6,549,193 B1 | 4/2003 | Huang et al. |
| 6,620,454 B2 | 9/2003 | Varaprasad et al. |
| 6,627,918 B2 | 9/2003 | Getz et al. |
| 6,706,552 B2 | 3/2004 | Getz et al. |
| 6,727,895 B2 | 4/2004 | Bottari et al. |
| 6,787,240 B2 | 9/2004 | Getz |
| 6,842,171 B2 | 1/2005 | Richter et al. |
| 7,165,323 B2 | 1/2007 | Halsey, IV et al. |
| 7,184,190 B2 | 2/2007 | McCabe et al. |
| 7,255,451 B2 | 8/2007 | McCabe et al. |
| 7,274,501 B2 | 9/2007 | McCabe et al. |
| 7,507,438 B2 | 3/2009 | Cherif et al. |
| 2001/0024685 A1 | 9/2001 | Boulton et al. |
| 2001/0055673 A1 | 12/2001 | Getz |
| 2002/0031622 A1 | 3/2002 | Ippel et al. |
| 2002/0086188 A1 | 7/2002 | Halsey, IV et al. |
| 2004/0137240 A1 | 7/2004 | Halsey, IV et al. |
| 2006/0066581 A1* | 3/2006 | Lyon et al. .................... 345/173 |
| 2006/0187214 A1* | 8/2006 | Gillespie et al. ............... 345/173 |
| 2006/0266640 A1* | 11/2006 | Halsey et al. ............ 204/192.29 |

\* cited by examiner

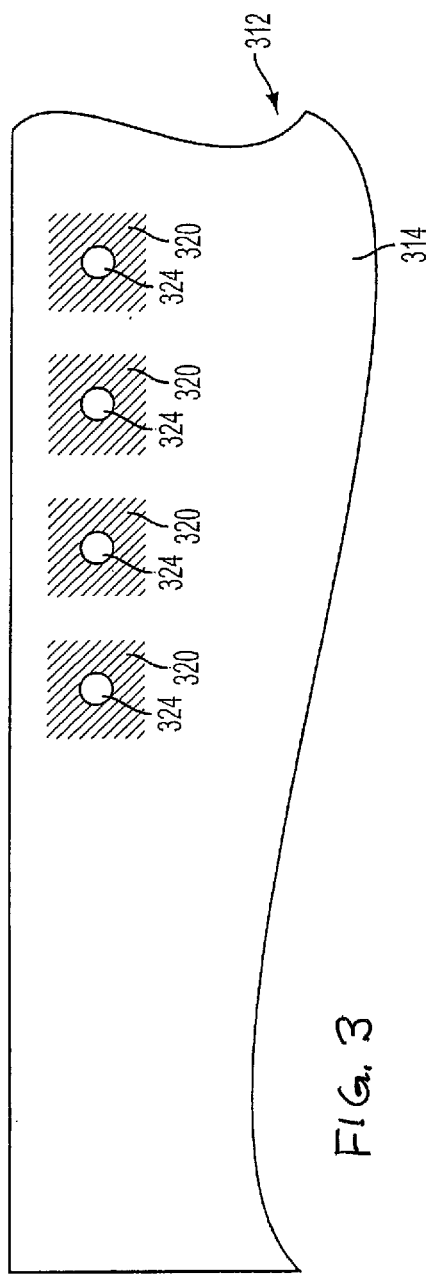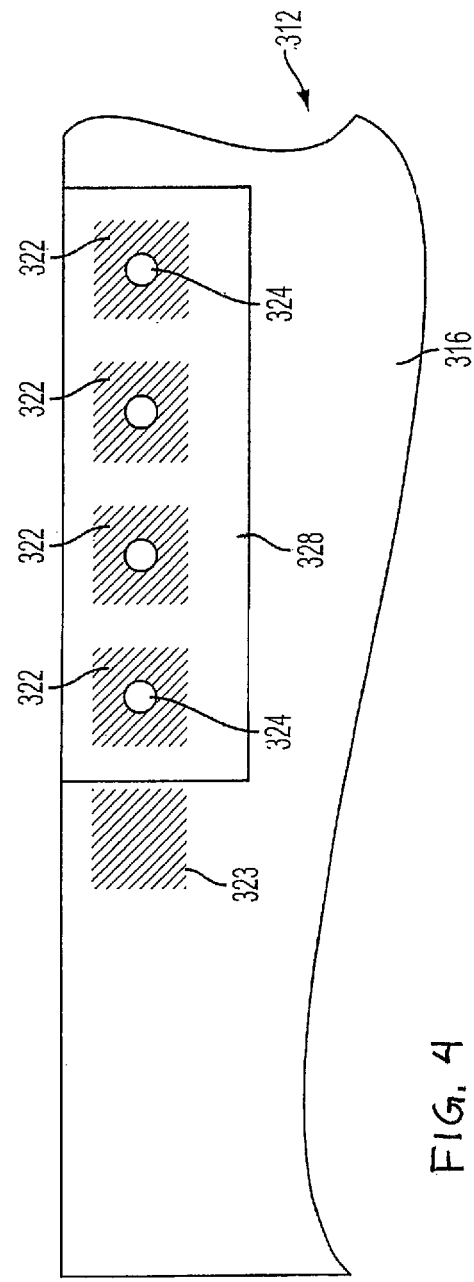

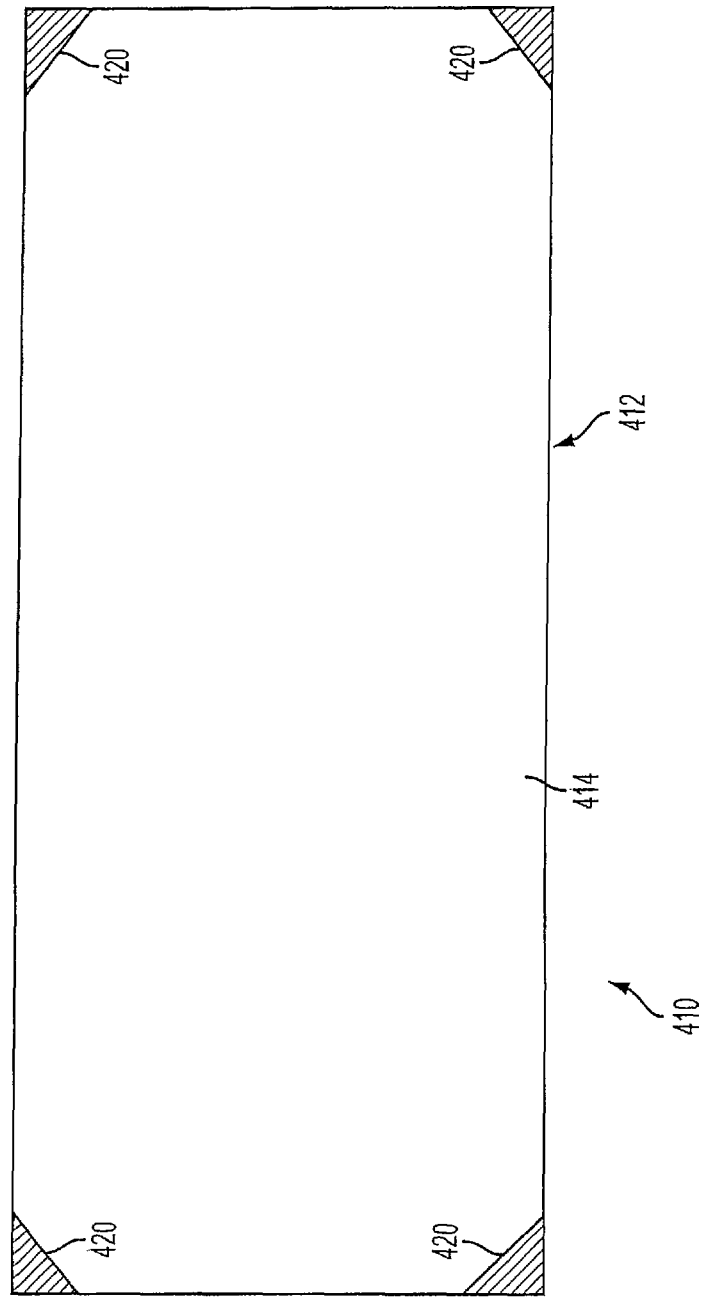

TOUCH SENSOR AND METHOD FOR MANUFACTURING SAME

CROSS REFERENCE TO RELATED APPLICATIONS

The present application claims the benefit of U.S. provisional application Ser. No. 61/048,402, filed Apr. 28, 2008, and the present application is a continuation-in-part of PCT Application No. PCT/US2008/071034, filed Jul. 24, 2008, which claims the benefit of U.S. provisional applications, Ser. No. 60/952,428, filed Jul. 27, 2007; and Ser. No. 61/048,402, filed Apr. 28, 2008, which are all hereby incorporated herein by reference in their entireties.

FIELD OF THE INVENTION

The present invention relates generally to touch sensors or touch screens and methods for manufacturing touch sensors and touch screens.

BACKGROUND OF THE INVENTION

As the use of touch screens, such as for public information kiosks, portable devices, and gaming applications and the like, increases, so does the need for more durable touch screen designs. Use of lamination configurations is a known technique to enhance durability of and add features (such as conductive, anti-glare, and anti-reflective coatings) to the touch screens. For example, using a transparent, conductively coated flexible plastic material, such as transparent conductively coated PET laminated to ultrathin glass (having a glass thickness preferably less than about 0.3 mm in thickness, more preferably less than about 0.2 mm in thickness, most preferably less than about 0.1 mm thickness) as the top sheet in a conventional resistive touch screen design (as shown in FIG. 1) is known in the art of touch screen manufacturing. The coating of flexible PET with a transparent conductive coating, such as by a web coating process, is also common process knowledge.

Typically, touch screens, and in particular capacitive touch screens, are manufactured via a multi-step process that includes multiple high temperature curing stages. For example, a touch screen may be manufactured by first washing a piece of flat glass, screen masking the glass surface where no conductive coating is desired and coating the glass surface with a transparent conductive coating, such as antimony tin oxide (ATO). The transparent conductive coating is then often fired at a high temperature of about 510 degrees Celsius or higher to improve properties thereof. The coated glass substrate is then washed and a conductive electrode, such as a silver conductive epoxy or paste portion, is printed onto the surface and then this is cured at a high temperature, such as about 480 degrees Celsius or higher. The glass is washed again and a hardcoat layer (such as an inorganic oxide, such as silicon dioxide) may be coated, such as by spraying, onto the glass, or the glass may be dipped into a precursor solution of the hardcoat coating. The hardcoat is then cured at a high temperature, such as about 520 degrees Celsius or thereabouts. A protective border layer may then be screened over the silver and may then be cured, such as via an ultraviolet (UV) curing process or, where a glass frit may be used, via another high temperature firing process. The glass is then cut to its final size and the edges are seamed before the touch screen is washed and packaged for shipping. The conductive coating is preferably antimony tin oxide due to the stability and uniformity of ATO during the multiple heat curing processes. Examples of such coatings and sensors or touch screens are described in U.S. Pat. Nos. 6,488,981; 6,549,193; 6,727,895; and 6,842,171, which are hereby incorporated herein by reference in their entireties.

It is known that in interactive information devices such as touch panels and pen-input devices, there is usually at least one rigid glass substrate coated with a transparent conductive coating such as indium tin oxide (ITO) or doped tin oxide. Depending on the coating deposition process, the transparent conductive coating may need to be further oxidized to achieve optimum transparency and further reduced to achieve optimum electrical conductivity. This curing process requires elevated temperature in a forced dry air environment followed by the introduction of an inert atmosphere forming gas. It is also known that in interactive information devices such as touch panels and pen-input devices, there are usually thick film electrode patterns deposited on the conductive films. These thick film electrode patterns, typically silver frit compounds, also need to be thermally bonded to the conductive thin film and the glass substrate under the conductive thin film.

SUMMARY OF THE INVENTION

The present invention provides a glass or plastic touch sensor or touch screen. The sensor or touch screen includes a substrate coated with a conductive coating and with a pattern of electrodes disposed thereon.

According to an aspect of the present invention, a flush-mountable touch sensor includes a substrate (such as a glass or plastic substrate) that is coated with a conductive coating (such as ITO or the like). The substrate has passageways or vias formed or established or drilled through the substrate, such that conductive material (such as a metallic material or the like) may be disposed or provided in and at least partially through the vias to establish conductive continuity through the substrate and between the front and rear surfaces of the substrate. For example, the conductive material (such as, for example, silver or other suitable metallic and/or conductive material) of the patterned electrodes may be disposed at a surface of the substrate and may flow into the vias and establish conductive continuity through the substrate and between the front surface of the substrate and the rear surface of the substrate. Thus, the conductive material in the vias allows for electrical connection to the conductive coating on the front surface of the substrate by electrically connecting a cable or electrical circuitry at the rear surface of the substrate, without any additional electrical connector or connectors at the front surface of the substrate.

These and other objects, advantages, purposes and features of the present invention will become more apparent upon review of the following specification in conjunction with the drawings.

BRIEF DESCRIPTION OF THE DRAWINGS

FIG. 3 is a front view of a capacitive sensor of the present invention, showing the silver pads and vias of the sensor;

FIG. 4 is a rear view of the capacitive sensor of FIG. 3, showing a deletion area to electrically isolate the vias;

FIG. 7 is a front view of a capacitive sensor of the present invention, showing the dipped silver corners;

DESCRIPTION OF THE PREFERRED EMBODIMENTS

Figure 1:
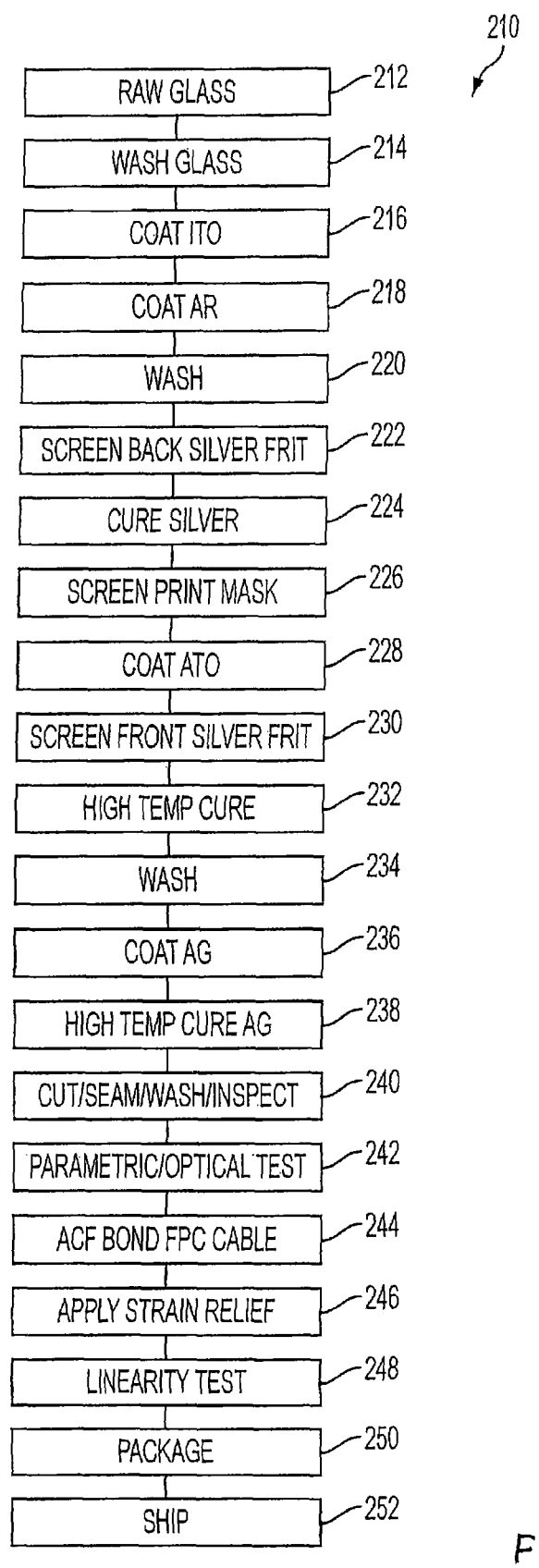
FIG. 1 is a process flow diagram of a process of forming a capacitive touch sensor.
Figure 2:
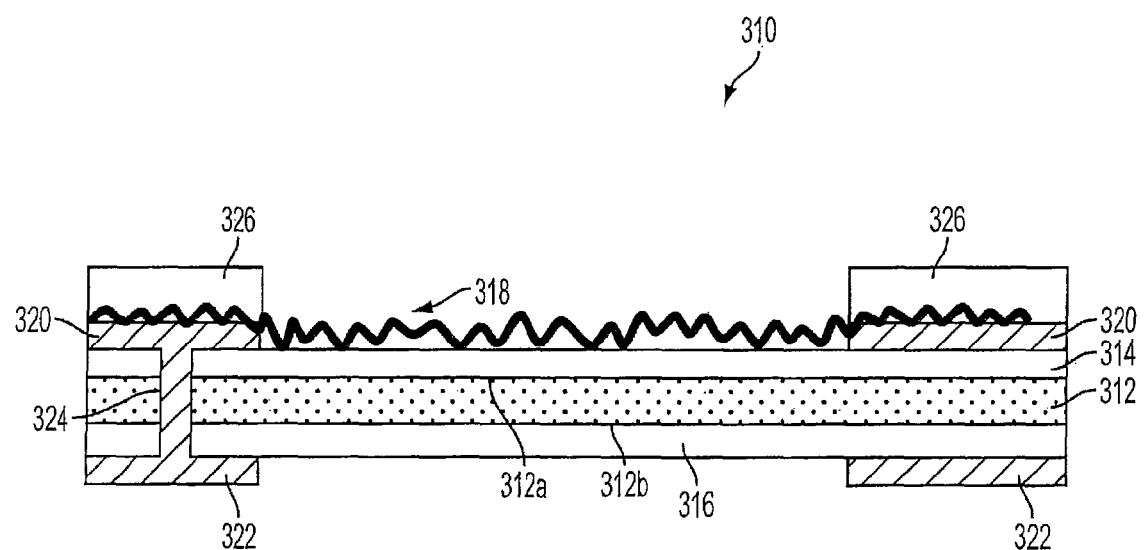
FIG. 2 is a sectional view of a touch screen in accordance with the present invention.

Referring now to the drawings and the illustrative embodiments depicted therein, surface capacitive sensor device that provides enhanced manufacturing and enhanced performance and that is highly suitable for use in "flush-mounted" applications, where the sensor may be mounted at an LCD or other display with its outer surface generally flush with the outer surface of the case or display or display case (such as generally flush with or generally co-planar with a bezel portion or casing portion of a display device) and with minimal (and preferably with no) bezel or perimeter frame around or encompassing the sensor and over the perimeter region of the outer surface of the sensor. The surface capacitive sensor can be manufactured in any suitable fashion (such as by utilizing conventional techniques or by utilizing aspects of the sensors and manufacturing processes described in U.S. Pat. Nos. 6,488,981; 6,549,193; 6,727,895; and/or 6,842,171; and/or U.S. provisional applications, Ser. No. 60/947,819, filed Jul. 3, 2007; and/or Ser. No. 60/952,428, filed Jul. 27, 2007; and/or PCT Application No. PCT/U.S. 08/68987, filed Jul. 2, 2008, which are all hereby incorporated herein by reference in their entireties), such as by using printed UV or IR curable dielectric or insulating tape over the edge electrode pattern to avoid contact with said electrode pattern. In addition, the connection joint for either the soldered flexible cable or anisotropic conductive film (ACF) attachment of the printed circuit is left exposed and secondarily covered with another material, such as tape or the like. In these constructions, the edge electrode and cable attachment may desirably be hidden under the bezel of the LCD or other display.

An exemplary process 210 for forming such a touch sensor is set forth in FIG. 1. For example, raw glass may be provided at 212 and washed at 214. Optionally, the glass may be coated with a transparent conductor (such as ITO) at 216 and may be coated with an AR coating at 218 and then may be washed at 220. A silver frit layer or pattern of electrodes may optionally be disposed or screened onto the rear surface of the substrate at 222 and cured at 224. A mask is screen printed onto the substrate at 226 and an ATO coating is applied at 228. A silver frit layer or pattern of electrodes is disposed or screened onto the front surface of the substrate at 230 and cured (such as by a high temperature curing process) at 232. The substrate is washed at 234 and coated with an AG coating at 236 and cured (such as by a high temperature curing process) at 238. The coated substrate is then cut, seamed, washed and inspected at 240 and tested at 242. The flexible cable is ACF bonded at 244 and a strain relief is applied at 246 and the product is tested at 248. The completed product is packaged at 250 and shipped or transported at 252.

Typically, a sensor has the electrical connection to the four signal terminations made at the front side of the substrate, such as generally at the front surface of the corner regions of the substrate, and thus is not a flush-mountable sensor due to the presence of the electrical connections at the front surface of the substrate. An aspect of the present invention is to redesign the sensor allowing it to be "flush-mounted" to the LCD and corresponding assembly. With such a sensor, the edge electrode and cable attachment do not need to be hidden under the bezel. Such constructions can be referred to as "flush-mounted" or "bezel-free" or "frameless". In such flush-mount constructions, the cable or electrical connection is moved to the backside of the sensor—since either the solder connection or the ACF connection typically cannot be done on the first surface (touch surface) of the glass without deleteriously impacting functional aesthetics. It is desirable that such a construction meet the following criteria:

1. an opaque border hides circuitry at the edge of the sensor (such an opaque or dark or black out perimeter coating may be disposed at the first or front surface of the substrate);
2. there is little or no added height from the interconnect between the sensor and the cables;
3. there is no false activation from contacting the opaque border (optionally, for example, the border area may be set to be inactive (dead zone) by the user or firmware or driver software); and
4. the opaque border meets the same standard for durability as the sensor.

To manufacture the sensor so that there is little or no added height resulting from the interconnect between the sensor and the cables (see requirement No. 2 above), there are three options discussed herein:

1. Paint the four signal terminations (such as at the corners of the substrate or otherwise if traces are used) of the sensor with conductive material that allows the signal to be transferred from the front surface to the rear of the glass (such as by wrapping the conductive material around the cut edge of the substrate to establish conductive continuity between the front surface of the glass substrate to the rear surface of the glass substrate).
2. Attach a secondary clip or connector to the four signal terminations (such as at the corners of the substrate or otherwise if traces are used).
3. Fabricate (such as by drilling or otherwise forming or establishing) passageways or vias through the glass substrate to allow connection between the four signal terminations and the rear of the glass.

The passageway or via (i.e. a hole or aperture formed or established through the substrate) formation of option No. 3 may provide the following benefits:

1. a lower profile over option No. 2 since the clips of option No. 2 add height to the substrate at the first surface and may not meet the true requirements of the "flush-mount" construction.
2. The paint option of option No. 1 may be hard to control the following: (a) the height of paint may cause visual disruption on the front or first surface or may require extra planarization to match the silver pattern; (b) the durability of the material may be suspect as low temperature materials are most commonly used; (c) there may be incompatibility concerns with the low temperature material and the opaque durable border processing; (d) the interconnect between the sensor and flex circuit may be compromised with the low temperature materials necessary for the paint option; (e) the impedance of signal channels is controlled by the conductivity of silver and paint materials and may be difficult to control to the level necessary for a capacitive sensor to properly function if a paint is used; and ( ) the silver on the edge may be visible unless an opaque border is printed on the edge of the glass.

The via option (see option No. 3 above) may be a preferred production concept because of the following:

1. Termination of vias at a single connection point on one side of the glass versus vias on each corner of the glass that would need to be routed back to a single connection point (using silver and isolation lines) on the back side of the glass. By terminating in one location instead of on the corners, the vias can be located in the middle of one of the sides of the sensor and moved away from the perimeter or edge regions of the glass substrate. This reduces or minimizes the potential for glass substrate breakage that may come with the drilled vias.
2. Isolation of the shield layer (when present—backside of the glass) from the vias post or pre deposition of the shield layer. Post isolation using laser deletion of the shield layer or pre-isolation using shadow mask or physical mask in coater at time of deposition.
3. The ability to use either a solder attachment to a flex laminated cable or an ACF to a flexible printed circuit to the flex cable.
4. Consistent resistance of conductive material through the vias does not significantly change impedance of any of the four signal carrying channels of the capacitive sensor and thus does not significantly alter or adversely effect the performance of the sensor.
5. The via construction allows for the opaque dielectric border to be printed in the mother glass state (large uncut glass substrate) versus the cut-to-size state that would be required with a painted application.

Another advantage of the process of the present invention for the flush mount constructions includes the benefits achieved by moving the connections away from the corners. For example, by moving the connections away from the corners, it may be easier to manufacture a surface capacitive sensor with shaped corners (radius and otherwise) that would be difficult to manufacture if the connection would have to be made in this region.

Referring now to FIGS. 2-5, a surface capacitive sensor 310 in accordance with the present invention is shown. In the illustrated embodiment, sensor 310 includes a rigid or flexible substrate 312 (such as a soda-lime glass substrate or a plastic or polymeric substrate or the like) with a transparent conductive layer 314 (such as a coating or layer of antimony tin oxide (ATO) or indium tin oxide (ITO) or the like) disposed on a front surface 312a thereof and optionally a shield coating 316 (such as an indium tin oxide (ITO) shield or coating or the like or similar transparent conductor coating or a similar EMI reducing coating or the like) disposed on a rear surface 312b thereof. The front or outer surface 312a of the glass substrate 312 is coated with a protective overcoat 318. A conductive coating or pad 320 (such as a silver material or silver paste or the like) may be disposed at the front surface of the substrate 312 and a conductive coating or pad 322 (such as a silver material or silver paste or the like) may be disposed at the rear surface of the substrate 312 and generally corresponding to the locations of the conductive coating or pads 320 at the front substrate. The sensor includes a plurality of pads 320, 322, which are patterned (such as at spaced apart locations around the perimeter regions of the substrate or along a selected perimeter edge region or the like) and are provided for electrical connection of the four signal terminations of the sensor.

One or more holes or passageways or vias 324 may be established through the substrate 312 (such as by drilling through the substrate at the desired or appropriate locations). The holes or vias are established at the regions where the pads 320, 322 are to be deposited or established, such that, during the establishing of the pads (such as by screening on or otherwise coating or establishing the conductive coating or paste at the substrate), a portion of the front conductive coating or pad 320 may flow into the respective via 324, while a portion of the rear conductive coating or pad 322 may flow into the respective via 324, whereby the conductive portions may meet or contact one another or electrically connect with one another within the via to establish electrical continuity through the substrate by the filled or partially filled vias 324. Optionally, and if desired or necessary to enhance or establish electrical continuity between the front and rear conductive coatings or pads, a secondary or additional or optional via filling process may be performed (such as via injecting or otherwise providing or establishing a conductive material into the passageways or vias), and may be performed before, during or after the establishing of the front and rear pads.

In the illustrated embodiment, an opaque masking layer 326 (such as an opaque dielectric material or dark or black mask or paint or ceramic frit or coating or the like) is disposed at the front of the substrate 312, such as at or around a perimeter region of the substrate (and generally corresponding to regions where the conductive pads are disposed). Although not shown, the front surface of the substrate may include isolation or deletion lines through the conductive coating to establish conductive continuity from the via locations to or toward the respective corner regions of the substrate (such as by way of continuous or uninterrupted conductive coating regions or strips defined by or demarcated by the isolation or deletion lines) so that the signals communicated through the vias are indicative of the signals at the respective corner regions of the substrate.

Figure 5:
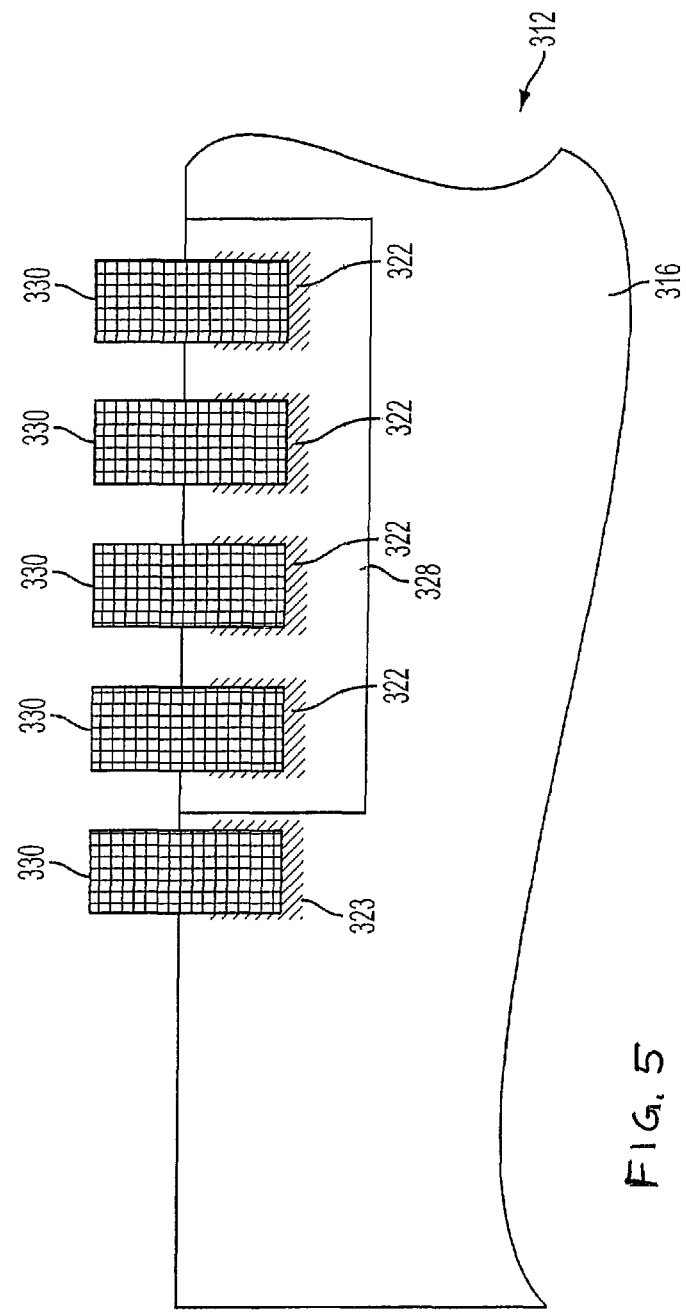
FIG. 5 is a rear view of the capacitive sensor of FIGS. 3 and 4, showing the cable leads at the vias.

As shown in FIGS. 3-5, the vias 324 may be spaced apart at or near a perimeter edge or edge region of the substrate and a deletion area 328 may be established through the conductive coating 314 (and through an optional shield coating if such a shield coating is established at the rear surface of the substrate) to electrically isolate the vias 324. For example, the entire pad area 328 at which the vias are established may be devoid of a conductive coating (such as via laser ablation or etching of the conductive coating or coatings or masking of the area during the coating process or the like) so that the pads established at and at least partially in the vias are electrically and conductively isolated from one another. Optionally, each pad area and/or via may be electrically and conductively isolated from the other pad areas and/or vias by respective deletion lines established through the conductive coating or coatings at and around each pad area or via, with the deletion lines being devoid of the conductive coating or coatings to electrically and conductively isolate adjacent vias and pad areas from one another and from the conductively coated main surface or active area of the substrate and sensor, while remaining within the spirit and scope of the present invention.

In the illustrated embodiment, there are four pads 322 with associated vias 324 to connect to the pads 320 at the front of the substrate so as to establish conductive continuity through the substrate and between the pads 320 and 322 by the vias 324. As shown in FIGS. 4 and 5, a fifth pad 323 may be formed at the rear surface of the substrate (and without an associated passageway or via through the substrate) for electrical connection to the rear shield layer or shield coating 316. As shown in FIG. 5, electrical cables or leads or connectors 330 may be electrically connected to the pads 322, 323 at the rear of the substrate 312 to electrically connect the sensor 310 to a power source or control or control circuitry, whereby the signals are communicated to circuitry that may determine the location of a surface contact to the sensor relative to the front corner regions or terminals or the like.

Figure 6A:
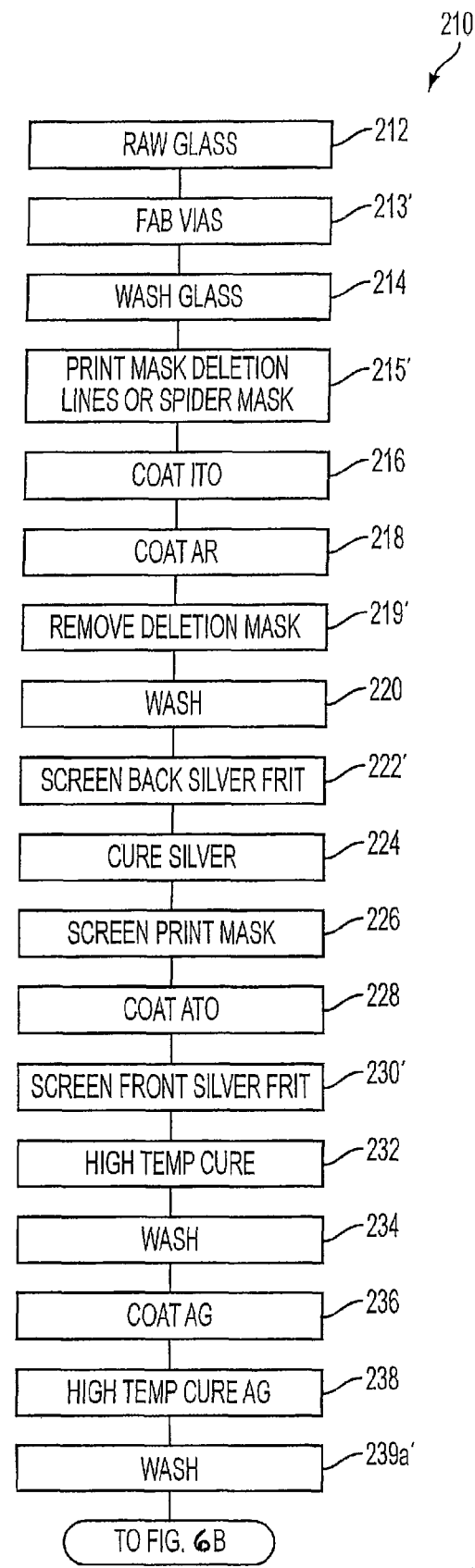
FIGS. 6A and 6B depict a process flow diagram of a flush mount capacitive sensor forming process having vias formed through the substrate in accordance with the present invention.
Figure 6B:
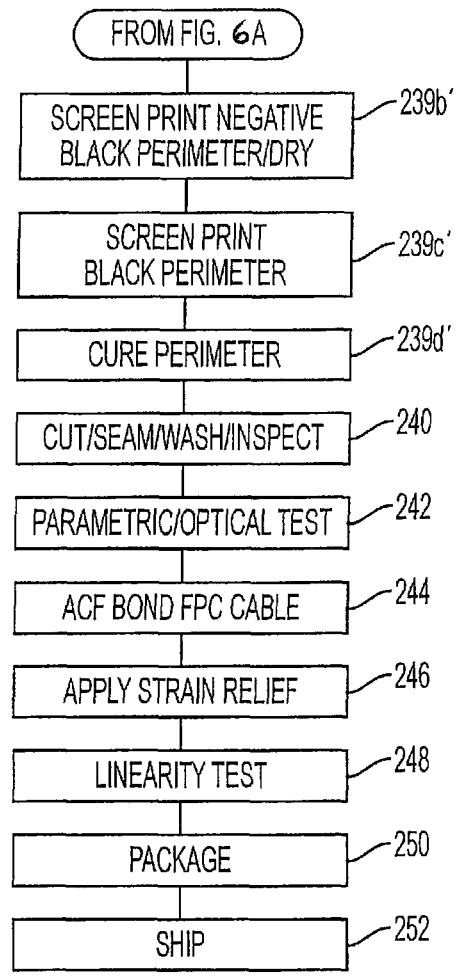

An exemplary process for forming the sensor 310 is set forth in FIGS. 6A and 6B. As can be seen in FIGS. 6A and 6B, a flush mount process flow 210' is generally similar to process flow 210, discussed above, and includes the step of fabricating or establishing or forming the vias at 213' in or through the raw glass and printing mask deletion lines or a spider mask on the substrate at 215' and removing the mask at 219' (if the mask is printed; if a spider mask is used, this step may be obviated) after the substrate has been coated with the ITO coating at 216 and coated with the AR coating at 218 (if these optional coatings are established at the substrate). When the back silver frit is applied at 222' (if this optional frit is applied) and when the front silver frit is applied at 230', the silver frit flows into the vias (such as by part of the back silver frit partially flowing into the vias and the front silver frit filling or substantially filling the remaining or as of yet unfilled portions of the vias) and establishes conductive continuity through the substrate. Optionally, and such as discussed above, a secondary or additional or optional via filling process may be performed to enhance or establish electrical continuity between the front and rear conductive coatings or pads, and may be performed before, during or after the establishing of the front and rear pads. After the AG coating is applied at 236 and cured at 238, the coated substrate is washed at 239a' and then a negative opaque or black perimeter layer may be screen printed onto the substrate and dried at 239b' and an opaque or black perimeter layer is screen printed onto the substrate at 239c' and cured at 239d'. The product is then formed and tested and finished and packaged and shipped at 240-252, such as in a similar manner as described above. The other steps of process flow 210' may be substantially similar to the corresponding steps of process flow 210, discussed above, and are referred to in FIGS. 6A and 6B with reference numbers similar to those of FIG. 2, such that a detailed discussion of these steps of the process flows need not be repeated herein.

Another step in manufacturing the flush-mount surface capacitive sensor of the present invention is the application of an opaque dielectric border over the electrode pattern. Such a border should meet some or all of these criteria:

1. The dielectric strength should be such that any touch on the border does not activate a positional touch on the sensor.
2. The durability should be such that the material cannot be removed by normal scratching of a finger, stylus or other everyday usage material.
3. The opacity should be such that any printed material cannot be seen through the border.
4. The thickness should be such that the tactile step height is minimized as much as possible.
5. The surface finish should desirably be either a matte or glossy appearance.

It is desirable to develop a process that meets the above requirements in both matte and glossy finish applications. To do so the following process steps are useful:

1. Black material selected is a high temperature ceramic frit vis-a-vis a UV or IR cured dielectric material. By selecting the ceramic material, the dielectric constant is high and durability is enhanced.
2. In order to meet the opacity requirements, a negative image of the underlying silver pattern preferably is printed or otherwise applied with either the same dielectric material or a comparable insulating material before the final complete border is printed. This is an important step in keeping the total thickness low and thus the tactile height minimal.
3. The opaque border is printed past what will be the cut edge of the sensor such that when cut, the black border is at the edge of the glass.

Figure 8:
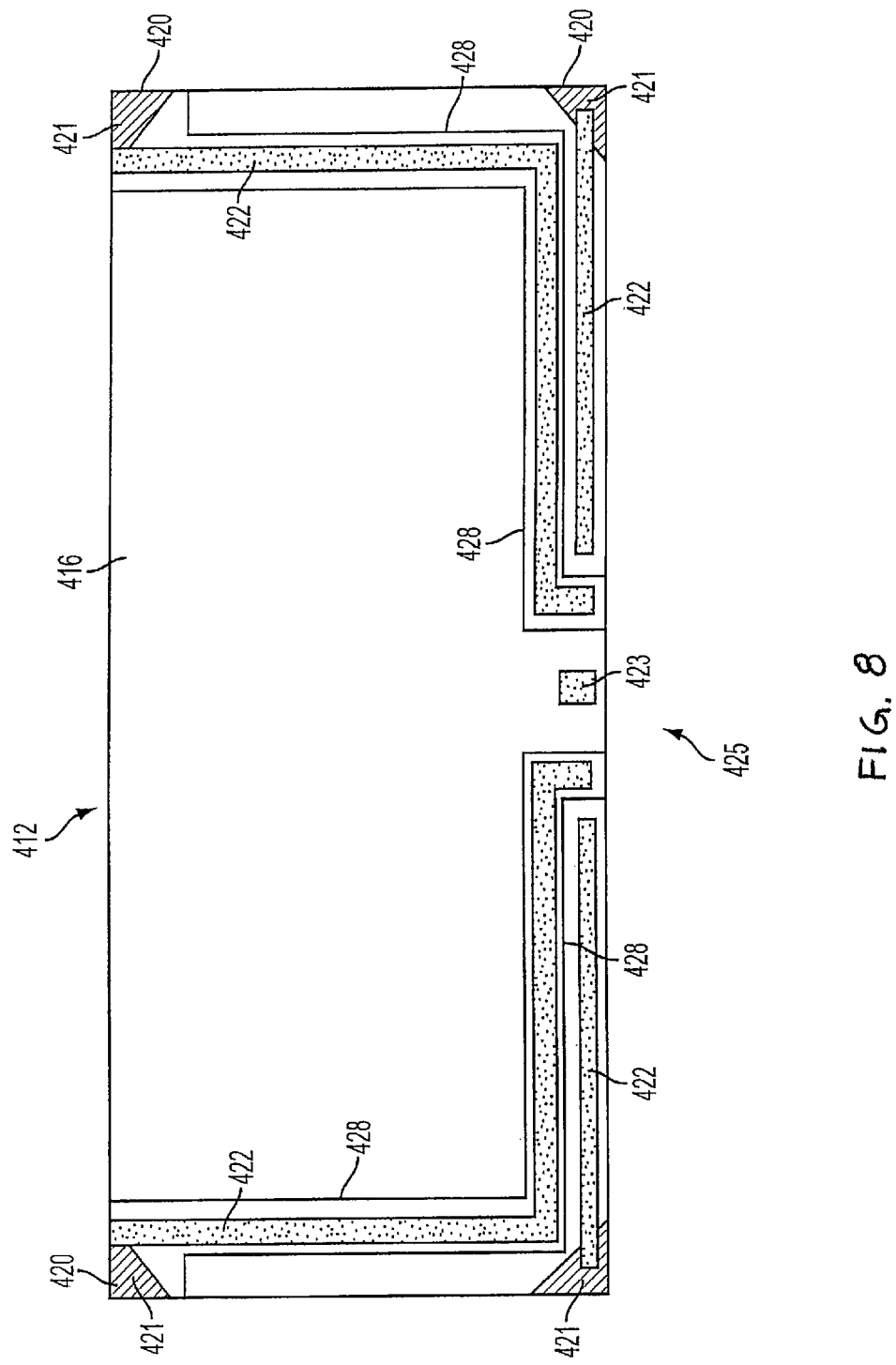
FIG. 8 is a rear view of the capacitive sensor of FIG. 7, showing the conductive traces connecting to the dipped corners and the deletion areas to electrically isolate the conductive traces.
Figure 9:
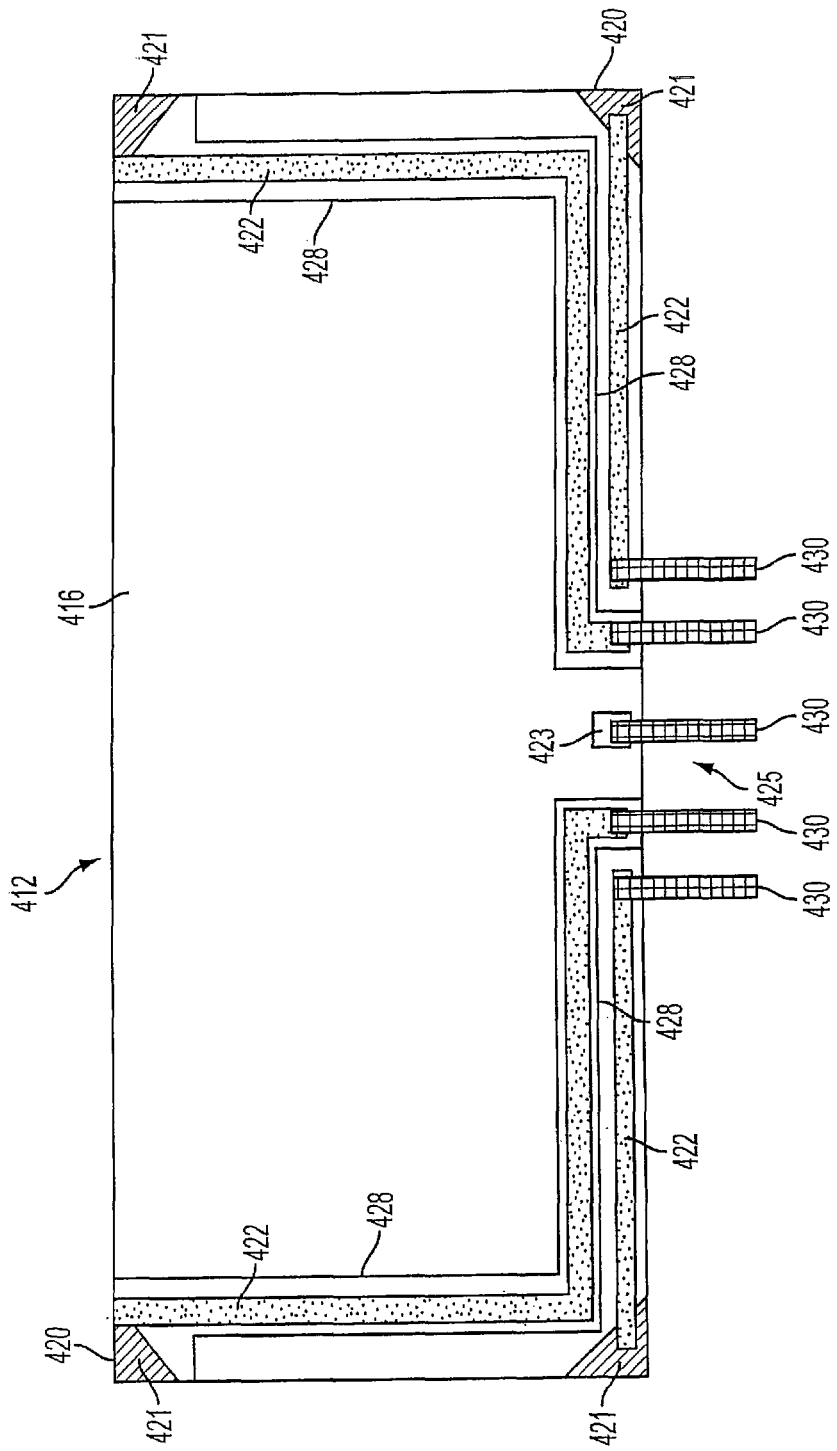
FIG. 9 is a rear view of the capacitive sensor of FIGS. 7 and 8, showing cable leads at the conductive traces.

Optionally, the four signal terminations may be electrically connected to the power or control by perimeter or corner conductive pads or portions. For example, and with reference to FIGS. 7-9, a surface capacitive sensor 410 includes a substrate 412 (such as a soda-lime glass substrate or a plastic or polymeric substrate or the like) with a transparent conductive layer 414 (such as a coating or layer of antimony tin oxide (ATO) or indium tin oxide (ITO) or the like) disposed on a front surface thereof (as can be seen in FIG. 7) and a shield coating 416 (such as an indium tin oxide (ITO) coating or the like or similar transparent conductor coating or a similar EMI reducing coating or the like) disposed on a rear surface thereof (as can be seen in FIGS. 8 and 9). The front or outer surface of the glass substrate 412 may be coated with a protective overcoat. As can be seen with reference to FIGS. 7-9, each corner of the substrate 412 may be coated by or dipped into a conductive material (such as a silver material or silver paste or the like) to establish conductive corners 420 having the conductive material disposed at each of the front and rear surfaces and having the conductive material wrap around the edge dimensions at the corners to establish conductive continuity between the front corner regions and the respective rear corner regions. Optionally, the conductive material may be screen printed or booby printed or pad printed at the front surface of the substrate and may wrap around the cut edge of the substrate to provide or establish conductive continuity between the front and rear surfaces at the coated corner regions of the substrate.

As shown in FIGS. 8 and 9, the rear conductive portions 421 of the conductive corners may be electrically connected to a connecting region 425 (such as a perimeter edge region) of the sensor by respective traces 422 (such as silver traces) electrically connected to the rear portions 421 of the conductive corners 420 and established along the rear surface of the substrate to the connecting region. A deletion line or area 428 may be established (such as by masking during the conductive coating process or by laser deletion of the conductive coating) at the rear surface of the substrate to electrically isolate the conductive traces. In the illustrated embodiment, there are four conductive corners with conductive traces associated therewith. As shown in FIGS. 8 and 9, a pad 423 may be formed at the rear surface of the substrate for electrical connection to the rear shield layer or shield coating 416. As shown in FIG. 13, electrical cables or leads 430 may be electrically connected to the pads conductive traces 421 and pad 423 at the rear of the substrate 412 to electrically connect the sensor 410 to a power source or control or circuitry, whereby the signals are communicated to circuitry that may determine the location of a surface contact to the sensor relative to the front corner regions or terminals or the like.

Figure 10A:
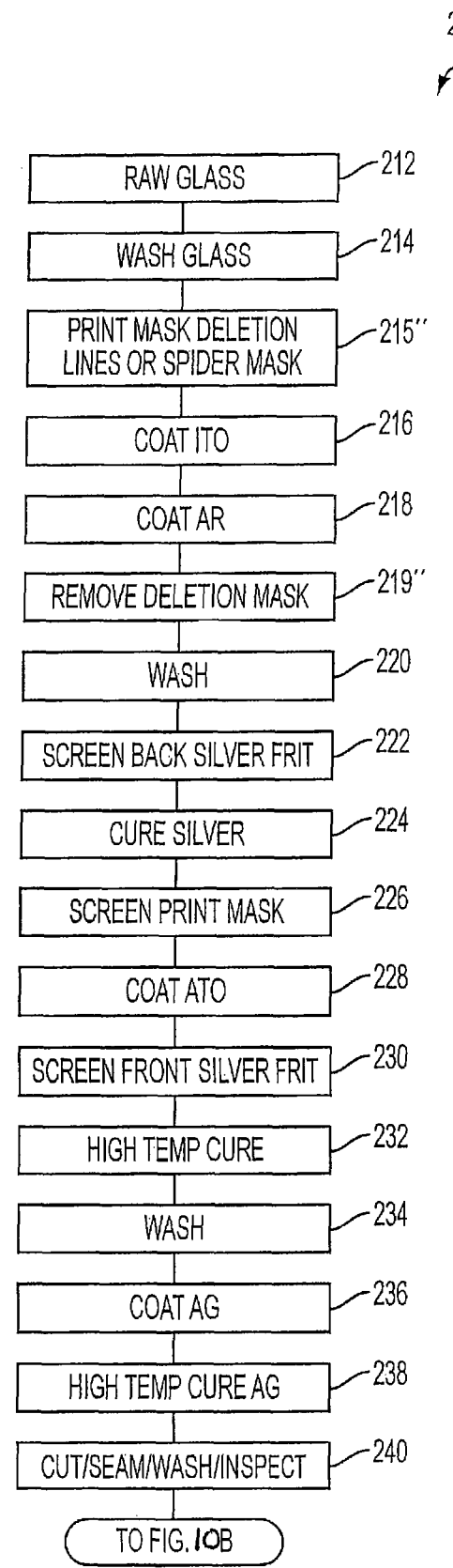
FIGS. 10A and 10B depict a process flow diagram of a flush mount capacitive sensor and dip process in accordance with the present invention.
Figure 10B:
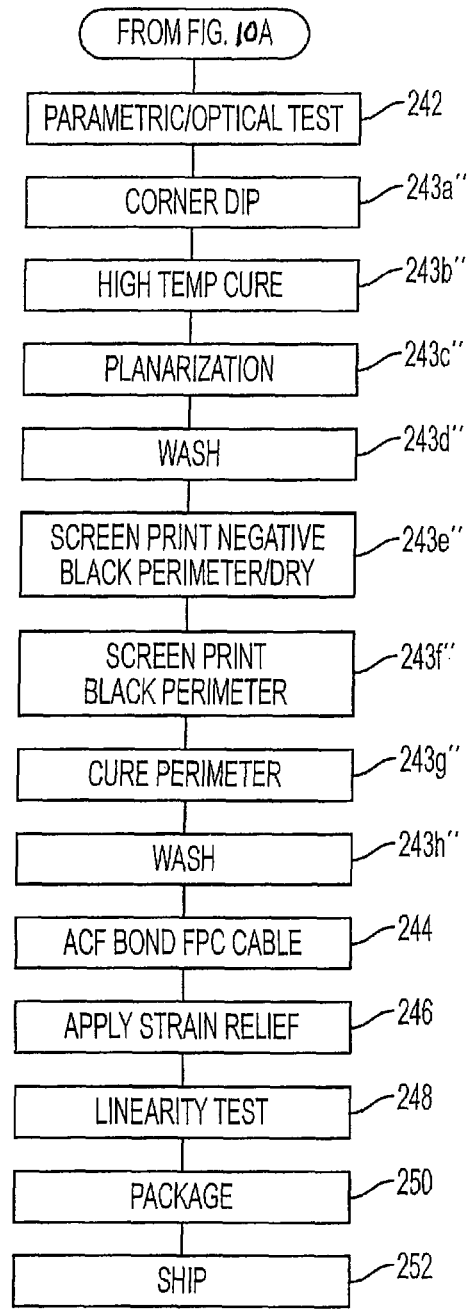

An exemplary process for forming the sensor 410 is set forth in FIGS. 10A and 10B. As can be seen in FIGS. 10A and 10B, a flush mount, process flow 210" is generally similar to process flow 210', discussed above (except with out the step 213' of fabricating vias), and includes the optional step of printing mask deletion lines or a spider mask on the substrate at 215" and removing the mask at 219" (if the mask is printed; if a spider mask is used, this step may be obviated) after the substrate has optionally been coated with the ITO coating at 216 and coated with the AR coating at 218. After the coated substrate is cut, seamed, washed and inspected at 240 and tested at 242, the corners of the substrate are dipped at 243a" and cured (such as by a high temperature cure) at 243b". The coated substrate is planarized at 243c". Then, and similar to steps 239a'-239d', discussed above, the coated substrate is washed at 243d" and a negative black perimeter optionally may be screen printed onto the substrate and dried at 243e" and an opaque or black perimeter layer is screen printed onto the substrate at 243f" and cured at 243g" and washed at 243h". The cable is then bonded and the product is tested and packaged and shipped at 244-252, such as in a similar manner as described above. The other steps of process flow 210" may be substantially similar to the corresponding steps of process flow 210, 210', discussed above, and are referred to in FIGS. 10A and 10B with reference numbers similar to those of FIG. 2, such that a detailed discussion of these steps of the process flows need not be repeated herein.

The corners may be coated with an electrically conductive layer or coating by any suitable coating process, such as by sputter deposition or other deposition techniques that coat the corner regions and that wrap around the edges of the substrate at the corner regions to establish conductive continuity between the coated front corner region and the coated rear corner region. Optionally, the coating process may utilize aspects of the coating processes and coated substrates and techniques and processes described in U.S. Pat. Nos. 7,274,501; 7,184,190; and/or 7,255,451, which are hereby incorporated herein by reference in their entireties. Optionally, the substrate may be coated in a chamber that may coat the corners or regions of the front and rear surfaces at the same time and/or with the same deposition process. Although shown and described as providing dipped or otherwise wrap-around coated corners, it is envisioned that the sensor of the present invention may coat other perimeter regions of the substrate with a wraparound type coating, whereby the front and rear perimeter regions are coated with a conductive coating and the associated perimeter edge of the substrate is also coated with a conductive coating to establish conductive continuity between the respective front and rear perimeter regions.

Optionally, the sensor or sensors may include a darkened mask or black mask (or other dark colored mask or masking layer or material), which may be directly printed on the outer surface or inner surface of the coated glass substrate. The mask may be desired to hide or mask or conceal or substantially hide or camouflage or render covert the silver pattern printed on the coated substrate. The mask may be UV cured—but could be IR cured at low temperature, depending on the particular application of the sensor and without affecting the scope of the present invention. Optionally, the mask may comprise a high temperature ceramic material if needed for increased dielectric constant.

Figure 11:
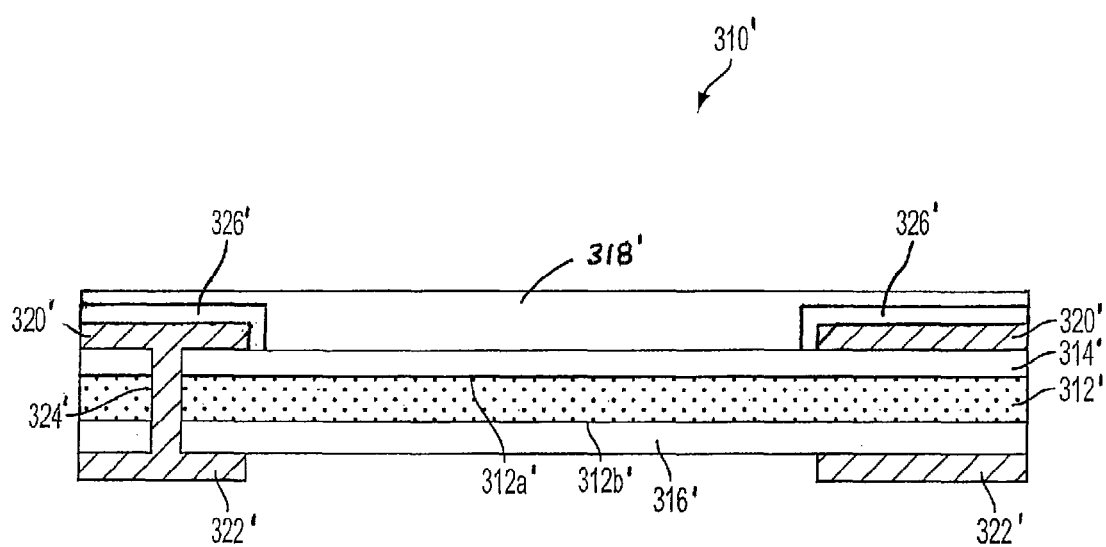
FIG. 11 is a sectional view of another touch screen in accordance with the present invention.

Optionally, and with reference to FIG. 11, a flush mount touch sensor 310' includes a rigid or flexible substrate 312' (such as a soda-lime glass substrate or a plastic or polymeric substrate or the like) with a transparent conductive layer 314' (such as a coating or layer of antimony tin oxide (ATO) or indium tin oxide (ITO) or the like) disposed on a front surface 312a' thereof and optionally a shield coating 316' (such as an indium tin oxide (ITO) shield or coating or the like or similar transparent conductor coating or a similar EMI reducing coating or the like) disposed on a rear surface 312b' thereof, such as in a similar manner as discussed above with respect to touch sensor 310. A conductive coating or pad 320' (such as a silver material or silver paste or the like) may be disposed at the front surface of the substrate 312' and a conductive coating or pad 322' (such as a silver material or silver paste or the like) may be disposed at the rear surface of the substrate 312' and generally corresponding to the locations of the conductive coating or pads 320' at the front substrate. The sensor includes a plurality of pads, which are patterned (such as at spaced apart locations around the perimeter regions of the substrate or along a selected perimeter edge region or the like) and are provided for electrical connection of the four signal terminations of the sensor. The touch sensor 310' includes a thin glass or plastic sheet or top sheet or cover sheet 318' disposed at the front surface 312a' of substrate 312'.

One or more holes or passageways or vias 324' may be established through the substrate 312', such as in a similar manner as described above. Optionally, an opaque masking layer 326' (such as an opaque dielectric material or dark or black mask or paint or ceramic frit or coating or the like) may be disposed at the front of the substrate 312', such as at or around a perimeter region of the substrate (and generally corresponding to regions where the conductive pads are disposed). Optionally, an opaque masking layer may be disposed on the thin sheet 318', such as on a rear surface of the thin sheet 318', while remaining within the spirit and scope of the present invention. Although not shown, the front surface of the substrate may include isolation or deletion lines through the conductive coating to establish conductive continuity from the via locations to or toward the respective corner regions of the substrate so that the signals communicated through the vias are indicative of the signals at the respective corner regions of the substrate.

The thin glass or plastic sheet 318' (such as a sheet of plastic or glass having a thickness of less than about 2 mm, such as a thickness of about 0.05 mm to about 1.6 mm or thereabouts) is disposed at the front surface 312a' of substrate 312' and over the transparent conductive layer 314', pads 320' and opaque layer 326'. The touch sensor 310' thus may be similar in construction to touch sensor 310, discussed above, but without the hard overcoat and with a thin glass or plastic sheet laminated at or to the front or first surface of the substrate. Optionally, the thin or top sheet may have optical enhancement coatings (such as antiglare or antireflective coatings or the like). In such a laminated flush mount touch sensor construction, the opaque border layer may be disposed on the base glass or plastic substrate (such as shown in FIG. 11) or on the thin top glass or plastic sheet (such as at or on the rear surface of the thin glass or plastic sheet), depending on the particular application of the touch sensor. Because the opaque layer is an intermediate layer (and is beneath the thin glass or plastic sheet and the base substrate), the opaque layer does not need to be as durable and hence a low temperature or UV curable ink or the like may be used as such an opaque layer.

Figure 12A:
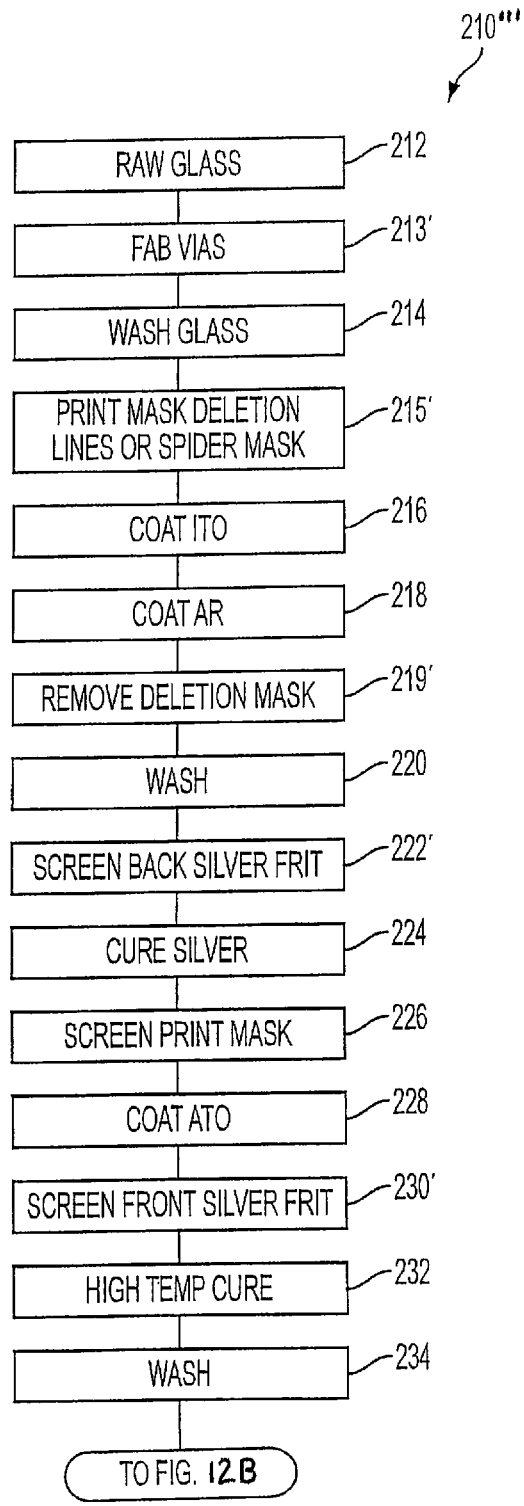
FIGS. 12A and 12B depict a process flow diagram of another flush mount sensor and dip process in accordance with the present invention.
Figure 12B:
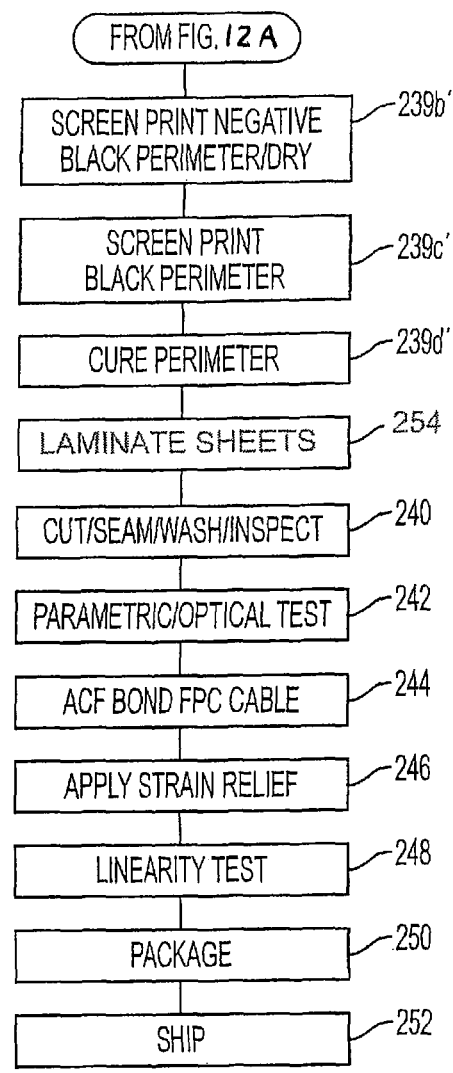

An exemplary process for forming the sensor 310' is set forth in FIGS. 12A and 12B. As can be seen in FIGS. 12A and 12B, a flush mount process flow 210''' may be generally similar to process flow 210', discussed above (except without the steps 236, 238 and 239a' of coating the AG coating, curing the AG coating and washing the substrate after curing the AG coating), and includes the step of laminating the sheets at 254 (FIG. 12B) to laminate or bond (such as via an optical adhesive or the like) the thin glass sheet at the front surface of the substrate. Optionally, a secondary via filling process or step may be provided to fill or at least substantially fill the vias to enhance or establish conductive continuity between the front and rear pads. Optionally, the negative black perimeter may be screen printed and dried at 239b', and the opaque or black perimeter may be screen printed at 239c' on either the top or bottom base glass substrate, and then cured at 239d'. After the sheets are laminated at 254, the assembled or laminated structure is cut and seamed, and the edges are processed or finished, and/or the structure is polished/washed and inspected at 240 and tested at 242. Optionally, the laminated glass may be cut via any suitable means, such as by use of an abrasive water jet, a laser cutting device or by use of any suitable mechanical means. The cable is then bonded and the product is tested and packaged and shipped at 244-252, such as in a similar manner as described above. The other steps of process flow 210''' may be substantially similar to the corresponding steps of process flow 210, 210', discussed above, and are referred to in FIGS. 12A and 12B with reference numbers similar to those of FIGS. 1, 6A and 6B, such that a detailed discussion of these steps of the process flows need not be repeated herein.

Optionally, although shown and described as having the passageways or vias filled with silver, clearly other suitable materials (such as other suitable conductive materials) may be used while remaining within the spirit and scope of the present invention, Optionally, it is envisioned that the vias may be planarized after filling to provide the desired or appropriate surface finish at the front and/or rear surface/surfaces of the substrate. Optionally, the order of the process steps set forth above and in FIGS. 6A, 6B, 10A, 10B, 12A and 12B may be changed without affecting the scope of the present invention. For example, the vias or passageways may be formed and filled after the base glass processing is complete.

Optionally, it is envisioned that aspects of the present invention may be applied to manufacturing of resistive touch screens to make flush mount resistive touch screens. In such a resistive touch screen application, it is envisioned that the thin top sheet may comprise an ITO coated polyester sheet or the like.

The process and/or finished product of the present invention may utilize aspects of the processes and/or products described in U.S. Pat. Nos. 4,490,227; 4,650,557; 4,655,811; 5,725,957; 6,001,486; 6,087,012; 6,440,491; 6,620,454; 6,627,918; 6,706,552; 6,787,240; and/or 7,165,323; and/or U.S. patent application Ser. No. 09/946,228, filed Sep. 5, 2001 by Ippel et al. for PLASTIC SUBSTRATE FOR INFORMATION DEVICE AND METHOD FOR MAKING SAME; Ser. No. 09/974,209, filed Oct. 10, 2001; Ser. No. 10/744,522, filed Dec. 23, 2003 by Halsey et al. for METHOD FOR MAKING AN INTERACTIVE INFORMATION DEVICE; Ser. No. 10/798,171, filed Mar. 11, 2004 by Getz for LASER DELETION FOR TOUCH SCREEN; Ser. No. 11/218,374, filed Sep. 2, 2005 by Cherif et al. for DISPLAY SUBSTRATE WITH DIFFUSER COATING, now U.S. Pat. No. 7,507,438; and/or Ser. No. 11/440,855, filed May 25, 2006, and/or U.S. provisional applications, Ser. No. 61/090,004, filed Aug. 19, 2008; Ser. No. 61/115,191, filed Nov. 17, 2008; and/or Ser. No. 61/151,977, filed Feb. 12, 2009; and/or PCT Application No. PCT/US2008/071034, filed Jul. 24, 2008, and/or PCT Application No. PCT/U.S. 08/68987, filed Jul. 2, 2008, which are all hereby incorporated herein by reference in their entireties.

Changes and modifications in the specifically described embodiments may be carried out without departing from the principles of the present invention, which is intended to be limited only by the scope of the appended claims as interpreted according to the principles of patent law.

The invention claimed is:

1. A touch sensor comprising:
 a substrate having a first surface and a second surface, said substrate having at least two passageways established through said substrate;
 a first conductive coating established at said first surface of said substrate;
 at least two conductive elements, each disposed at least partially through each respective one of said passageways of at said substrate and electrically connected to said first conductive coating, establishing conductive continuity between said first and second surfaces of said substrate and wherein said conductive elements are electrically isolated from one another at said second surface of said substrate; and
 a thin sheet disposed at said first surface of said substrate.

2. The touch sensor of claim 1, wherein said touch sensor comprises a capacitive touch sensor.

3. The touch sensor of claim 1 further comprising at least two conductive connectors, each of said at least two conductive connectors being conductively connected to a portion of each respective one of said conductive elements at said second surface of said substrate.

4. The touch sensor of claim 1, wherein said at least two passageways comprise four passageways.

5. The touch sensor of claim 1, wherein said at least two passageways are established inboard of a perimeter edge of said substrate.

6. The touch sensor of claim 1, wherein said substrate is at least one chosen from a glass substrate and a plastic substrate.

7. The touch sensor of claim 1, wherein said substrate is a flexible plastic substrate, and wherein said conductive coating comprises a transparent conductive coating.

8. The touch sensor of claim 1, wherein said conductive coating comprises a transparent conductive coating.

9. The touch sensor of claim 1, wherein said thin sheet comprises one of a thin glass sheet and a thin plastic sheet.

10. The touch sensor of claim 1, wherein each of said conductive elements is disposed at least partially over said first surface proximate to said respective one of said passageways.

11. The touch sensor of claim 1, wherein each of said conductive elements is disposed at least partially over said second surface proximate to said respective one of said passageways.

12. The touch sensor of claim 1, wherein each of said conductive elements comprises a first conductive material disposed at said first surface and partially into said respective one of said passageways and a second conductive material disposed at said second surface and partially into said respective one of said passageways, said first and second conductive materials contacting one another in said respective one of said passageways to establish conductive continuity between said first and second surfaces of said substrate.

13. The touch sensor of claim 12, wherein said first conductive material and said second conductive material comprise silver material or silver paste.

14. A method of manufacturing a touch sensor, said method comprising:
 providing a substrate having a first surface and a second surface;
 establishing a conductive coating at said first surface of said substrate;
 establishing at least two passageways through said substrate;
 providing at least two conductive elements at said substrate, each of said conductive elements being disposed at least partially through each respective one of said passageways and being electrically connected to said first conductive coating, establishing conductive continuity between said first and second surfaces of said substrate and wherein said conductive elements are electrically isolated from one another at said second surface of said substrate; and providing a thin sheet and attaching said thin sheet to said first surface of said substrate.

15. The method of claim 14, wherein attaching said thin sheet at said first surface of said substrate comprises laminating said thin sheet to said first surface of said substrate.

16. The method of claim 14, wherein said substrate is a glass substrate or a plastic substrate.

17. The method of claim 14, wherein said thin sheet is at least one chosen from a thin glass sheet and a thin plastic sheet.

18. The method of claim 14, wherein providing conductive elements comprises: establishing at least two first conductive pads, each disposed at said first surface proximate to said respective one of said passageways and at least partially filling said respective one of said passageways with the conductive material of said first conductive pad; establishing at least two second conductive pads, each disposed at said second surface proximate to said respective one of said passageways and at least partially filling said respective one of said passageways with the conductive material of said second conductive pad; and wherein said conductive material of said second conductive pad contacts said conductive material of said first conductive pad to establish conductive continuity between said first and second pads at said first and second surfaces of said substrate.

19. The method of claim 18, wherein said first conductive pads and said second conductive pads comprise silver material or silver paste.

20. The method of claim 18, wherein said second conductive pads of each respective one of said at least two passageways are electrically isolated from one another at said second surface of said substrate.

21. The method of claim 18, further comprising attaching at least two conductive connectors, each of said at least two conductive connectors being conductively connected to a portion of a respective one of said second conductive pads at said second surface of said substrate.

\* \* \* \* \*